United States Patent [19]

Wahlen

[11] Patent Number: 4,872,341

[45] Date of Patent: Oct. 10, 1989

[54] SEALING JOINT

[75] Inventor: Erika Wahlen, Erlinsbach, Switzerland

[73] Assignee: Kern & Co., Aarau, Switzerland

[21] Appl. No.: 232,997

[22] Filed: Aug. 17, 1988

[30] Foreign Application Priority Data

Sep. 2, 1987 [CH] Switzerland ............ 3360/87

[51] Int. Cl.$^4$ .............. G12B 9/04; G01C 15/00; G01D 11/24; F16J 15/04
[52] U.S. Cl. .................... 73/431; 220/4 R; 220/76
[58] Field of Search ............ 73/431; 220/77, 78, 220/76, 75, 4 R

[56] References Cited

U.S. PATENT DOCUMENTS

| Re. 32,762 | 10/1988 | Katzmann et al. | 220/76 X |
|---|---|---|---|
| 439,893 | 11/1890 | Peacock | 220/75 X |
| 3,498,597 | 3/1970 | Roberts et al. | 220/4 R X |
| 3,854,269 | 12/1974 | Hancock | 220/76 X |
| 3,902,623 | 9/1975 | Brown | 220/76 X |
| 3,907,050 | 9/1975 | Mullins | 220/77 X |
| 4,004,348 | 1/1977 | Fowler et al. | 73/431 X |
| 4,221,302 | 9/1980 | Kupersmit | 220/4 R X |
| 4,222,576 | 9/1980 | Clements | 220/77 X |
| 4,673,087 | 6/1987 | Webb | 220/76 X |
| 4,757,909 | 7/1988 | Matsuura | 220/77 X |

FOREIGN PATENT DOCUMENTS

| 222727 | 12/1958 | Australia | 220/76 |
|---|---|---|---|
| 2939646 | 4/1981 | Fed. Rep. of Germany | 73/431 |
| 2949863 | 6/1981 | Fed. Rep. of Germany | 73/431 |
| 3205965 | 9/1983 | Fed. Rep. of Germany | 220/77 |
| 115742 | 9/1979 | Japan | 220/76 |
| 1219336 | 1/1971 | United Kingdom | 220/75 |

Primary Examiner—Tom Noland
Attorney, Agent, or Firm—Burns, Doane Swecker & Mathis

[57] ABSTRACT

A tight sealing is provided at the junction of three joints between three flat components. The components are joined to each other by sealing elements, which may be of the inserting or receiving type. The tight seal is achieved by providing an inserting element with a groove such that it gets a double function, at the same time being inserted into one sealing element and receiving another sealing element at the junction.

7 Claims, 2 Drawing Sheets

SEALING JOINT

BACKGROUND OF THE INVENTION

The present invention relates to a sealing system between three flat components. In a more specific aspect, the invention is concerned with surveying instrument casings made up of plastic parts provided with edge portions of distinctive shapes that permit such portions to be snapped together to form a completed casing that will not leak and that will protect the instrument from deterioration stemming from the influence of moisture.

It has been proposed to form sealing joints from two oblong sealing elements interlocking along the edges of the components to be joined. One of the sealing elements is shaped as a receiving element and the other is shaped as an inserting element adapted to be inserted into the receiving elements, as shown in West German Patent Application DE-A-2904636 (Modern Precision Engineers). Such joints fail to give a tight seal when three components must be joined together because the change-over from receiving element to inserting element on the same component will produce leaks.

One of the objects of the present invention is to provide a sealing system between interlocking sealing elements that will give a tight seal even when three joints, each between two components, intersect in one common point.

SUMMARY OF THE INVENTION

According to one aspect of the invention, three flat components are joined together and sealed through sealing elements extending along their edges. The adjacent sealing elements snap together by reason of the configurations of their adjacent edge portions, with the edge of one having a U-shaped cross section into which the edge of the other may be inserted. It is a feature of the invention that, within the area around the intersection of the three joints between the three flat components, an inserting element of a first flat component is received by a receiving element of a third flat component and itself has a U-shaped recess for receiving an inserting element of the second flat component, the arrangement being such that, while the inserting element of the first component is inserted into the receiving element of the third flat component, it is also receiving the inserting element of the second component.

According to another aspect of the invention, the inserting element of the second flat component may, within the area of its interlocking with the inserting element of the first flat component, have a thickness that is relatively small as compared to its thickness within the area of its interlocking with the receiving element of the third flat component. A sealing element of the second flat component for interlocking with the first as well as with the third flat component may be an inserting element, which has a thickness that is considerably smaller within the area of its interlocking with the sealing element of the first flat component as compared to its thickness within the area of its interlocking with the sealing element of the third flat component.

Further, a surveying instrument, or the like, may be provided with a plastic casing made up of multiple parts joined together at their adjacent edge portions through sealing elements having the features described herein. The sealing elements may be snapped together to readily provide joints which may be disassembled when necessary but which are effectively leak proof in service.

These and other objects, advantages and features of the present invention will be apparent to one skilled in the pertinent art from the accompanying description of a preferred embodiment of the invention and the appended claims when considered in conjunction with the drawings.

DETAILED DESCRIPTION OF A PREFERRED EMBODIMENT

Figure 1:
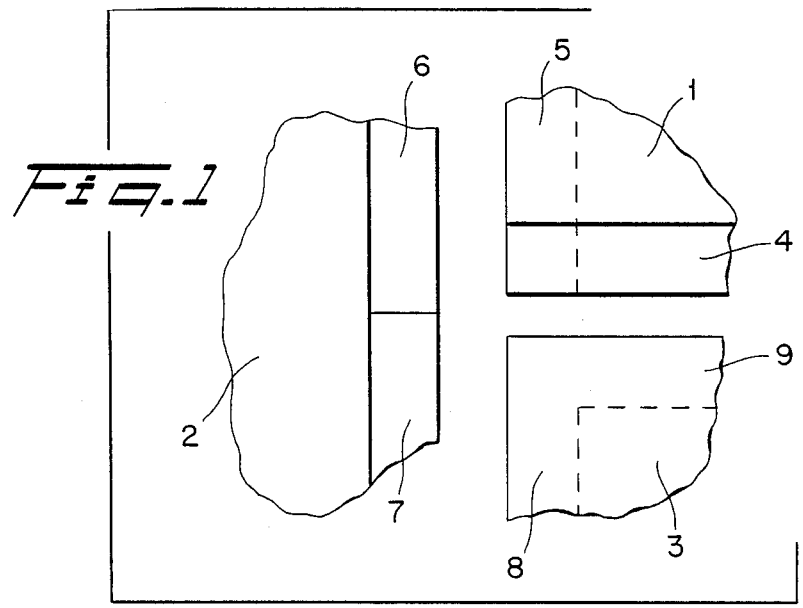
FIG. 1 is a top view of three flat components to be joined by sealing elements.

FIG. 1 shows three platelike components 1, 2 and 3 having straight sealing elements in a position to be joined to each other. These components may, for example, be parts of a plastic casing for a surveying instrument.

Component 1 has a sealing element 4 along its edge portion facing component 3 and another sealing element 5 along its edge portion facing component 2.

Component 2 similarly has two sealing elements 6 and 7. Sealing element 6 faces component 1, and sealing element 7 faces component 2.

Component 3 has a sealing element 9 along its edge portion facing component 1 and has a sealing element 8 along its edge portion facing component 2.

Figure 3:
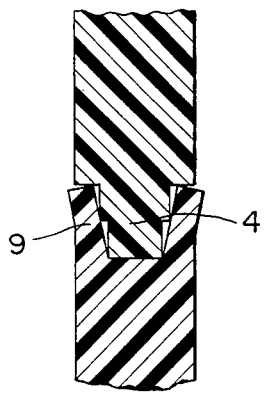
FIG. 3 is a sectional view of two joined components along the line A—A of FIG. 2.
Figure 4:
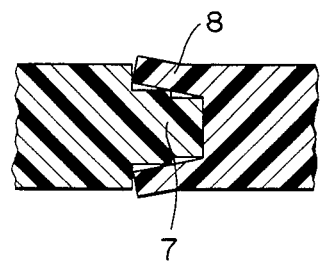
FIG. 4 is a sectional view of two joined components along the line B—B of FIG. 2.
Figure 5:
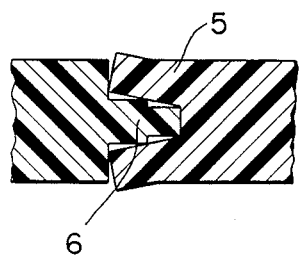
FIG. 5 is a sectional view of two joined components along the line C—C of FIG. 2.

Each sealing element is made either as an inserting element or as a receiving element to receive a corresponding inserting element. As better shown in the sectional views of FIGS. 3 to 5, the sealing elements 4, 6 and 7 are lands or tongues to be inserted, and the sealing elements 5, 8 and 9 are U-shaped receiving elements.

Figure 2:
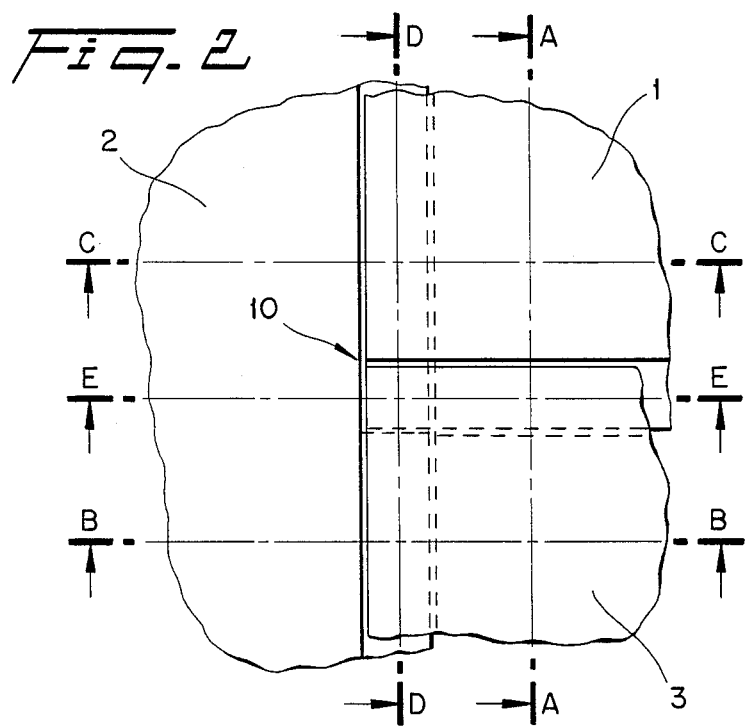
FIG. 2 shows the three components of FIG. 1 in their joined position.

As shown in FIG. 2, the components 1, 2 and 3 are joined to each other by means of their sealing elements 4 to 9. A problem may arise at the change-over in the area indicated by 10 from inserting element 4 on component 1 to receiving element 5 also on component 1. If the change-over portion were simply left open without any inserting or receiving element, a leak would be likely to arise. Moreover, if the inserting element 4 were extended through the area 10, inserting elements 4 and 6 would face each other and joining components 1 and 2 together would be impossible.

Figure 7:
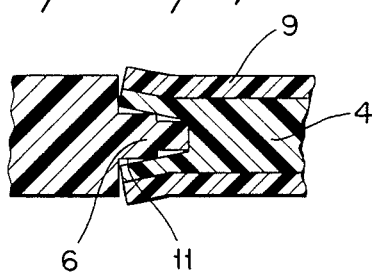
FIG. 7 is a sectional view along the line E—E of FIG. 2 at right angles to line D—D and passing through the area around the intersection of three joints.

This problem is avoided in accordance with the invention by making the land 4 with a thickness sufficient to work out a U-shaped groove 11, as shown in FIG. 7. In the preferred embodiment shown, the groove 11 continues the U-shaped profile of the receiving element 5 of component 1. Thus groove 11 and receiving element 5 have the same inner span. The groove 11 of the inserting element 4 receives the inserting element 6 of component 2, so joining components 1 and 2 now is done without any problem. The sealing element 4 of component 1 within the change-over area 10, is at the same time, an inserting element with respect to sealing element 9 of component 3 and a receiving element with respect to sealing element 6 of component 2.

Figure 6:
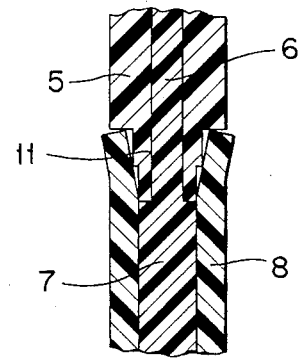
FIG. 6 is a sectional view along the line D-D of FIG. 2 passing through the area around the intersection of three joints.

The sectional view of FIG. 6 illustrates the position of the sealing elements within the change-over area 10. The sealing element 5 of component 1 is provided with a relatively narrow U-shaped groove receiving the corresponding element 6 of component 2. This groove is continued by groove 11, while element 5 becomes element 4 and element 6 becomes element 7, each pair on the same component 1 and 2 respectively. As shown, the entire change-over area 10 is filled up by the sealing elements 6, 5 and 9 enclosing each other and forming a leak proof press or snap fit.

The present invention is not limited in scope to the above described preferred embodiment. If an enhanced stability of the joint between components 1 and 2 is required, the inserting element 6, being rather thin at its passage through the groove 11 of land 4, may have an increased thickness like that of element 7 outside the area 10 such that the sections B—B of Fig. 4 and C—C of FIG. 5 would appear to be equal. The sealing elements 4 to 9, being shown to be moulded integrally with the components 1, 2 and 3, may also be made as separate fitting strips, which may be continuous and flexible and are subsequently fixed to the components 1, 2 and 3. The flat components need not be planar or platelike, they may also be ends or flanges of pipes. The invention is preferably used for tight seals of plastic components of casings for surveying and other types of instruments.

What is claimed is:

1. Sealing joint between three flat components each having sealing elements along its edges for joining the component to each other, each of said sealing elements being either an inserting element to be received by another sealing element or a receiving element of U-shaped transverse section for interlocking with a corresponding inserting element, wherein an inserting element of a first flat component to be received by a receiving element of a third flat component within the area around the intersection of the three joints between the three flat components has a U-shaped recess for receiving an inserting element of the second flat component such that the inserting element of the first component is itself receiving the inserting element of the second component while it is inserted into the receiving element of the third flat component.

2. Sealing joint a claimed in claim 1, wherein the inserting element of the second flat component has, within the area of its interlocking with the inserting element of the first flat component, a thickness that is considerably smaller than its thickness within the area of its interlocking with the receiving element of the third flat component.

3. Sealing joint as claimed in claim 2, wherein the sealing elements are provided at the joints of the casing of an instrument.

4. Sealing joint as claimed in claim 1, wherein a sealing element of the second flat component for interlocking with the first as well as with the third flat component is an inserting element, which has, within the area of its interlocking with the sealing element of the first flat component, a thickness considerably smaller than its thickness within the area of its interlocking with the sealing element of the third flat component.

5. Sealing joint as in claim 4, wherein the sealing elements are provided at the joints of the casing of an instrument.

6. Sealing joint as claimed in claim 1, wherein the sealing elements are provided at the joints of the casing of an instrument.

7. A surveying instrument having a plastic casing for protecting parts of the instrument against damage from moisture, said comprising three components detachably connected together at their adjacent edge portions with a press fit along joints three of which meet at a common point, said detachable connection being established through interlocking sealing elements of which have projecting lands and some of which have recesses for receiving lands from other sealing elements, a first of said components of said casing being provided with a sealing having in the vicinity of said common point a land which is received within a recess in a sealing element of a third of said casing components and which land has therein a recess for receiving a land from a sealing element of a second of said casing components.

* * * * *